United States Patent
Aydin et al.

(10) Patent No.: US 10,379,191 B2
(45) Date of Patent: Aug. 13, 2019

(54) APPARATUS AND METHOD FOR VECTOR S-PARAMETER MEASUREMENTS

(71) Applicant: GLOBALFOUNDRIES INC., Grand Cayman (KY)

(72) Inventors: Adem G. Aydin, Newport Beach, CA (US); Hanyi Ding, Colchester, VT (US)

(73) Assignee: GLOBALGOUNDRIES INC., Grand Cayman (KY)

( * ) Notice: Subject to any disclaimer, the term of this patent is extended or adjusted under 35 U.S.C. 154(b) by 51 days.

(21) Appl. No.: 15/868,248

(22) Filed: Jan. 11, 2018

(65) Prior Publication Data

US 2018/0136304 A1 May 17, 2018

Related U.S. Application Data

(62) Division of application No. 15/015,176, filed on Feb. 4, 2016, now Pat. No. 9,910,124.

(51) Int. Cl.
*G01R 35/00* (2006.01)
*G01R 27/28* (2006.01)
*G01R 27/02* (2006.01)

(52) U.S. Cl.
CPC ........... *G01R 35/005* (2013.01); *G01R 27/02* (2013.01); *G01R 27/28* (2013.01)

(58) Field of Classification Search
CPC ....... G01R 27/28; G01R 27/02; G01R 35/005
USPC ...................................... 324/638, 650, 601
See application file for complete search history.

(56) References Cited

U.S. PATENT DOCUMENTS

| | | | | |
|---|---|---|---|---|
| 4,808,912 A | * | 2/1989 | Potter | G01R 27/06 324/601 |
| 2002/0082792 A1 | | 6/2002 | Bourde et al. | |
| 2002/0186098 A1 | | 12/2002 | Sayyah | |
| 2008/0191712 A1 | * | 8/2008 | Eisenstadt | G01R 27/28 324/638 |
| 2015/0268218 A1 | | 9/2015 | Troxler | |

OTHER PUBLICATIONS

KF50BS., "How it works: Quadrature detector", KF50BS/IP RF Electronics Engineering Blog,https://jaunty-electronics.com/blog/2012/09/how-it-works-quadrature-detector, Sep. 3, 2012, 8 pages.

(Continued)

*Primary Examiner* — Amy He
(74) *Attorney, Agent, or Firm* — Michael Le Strange; Andrew M. Calderon; Roberts Mlotkowski Safran Cole & Calderon, P.C.

(57) ABSTRACT

The disclosure relates to an apparatus and a method for vector scattering parameter (s-parameter) measurements, and more particularly, to an apparatus and a method for providing a simple, low cost solution for tests requiring vector s-parameter measurements. The apparatus includes a source which provides an input signal, a divider which splits the input signal to a reference signal and a testing signal, a phase shifter which shifts the reference signal by a first phase and outputs a phase shifted signal, a device under test (DUT) which shifts the testing signal by a second phase and outputs a DUT shifted signal, a combiner which combines the phase shifted signal and the DUT shifted signal into a combined signal, and a detector which detects a product of the phase shifted signal and the DUT shifted signal.

9 Claims, 6 Drawing Sheets

(56) References Cited

OTHER PUBLICATIONS

Agilent., AN 1287-3, "Applying Error Correction to Network Analyzer Measurements", Mar. 27, 2002, 16 pages.
Li,"Circuit Modules for Broadband CMOS Six-Port Systems", Clemson University, Dec. 2010, 131 pages.
Hoer, "The Six-Port Coupler: A New Approach to Measuring Voltage, Current, Power,Impedance, and Phase",IEEE Transactions on Instrumentation and Measurement, vol. IM-21, No. 4, Nov. 1972, pp. 466-470.
Agilent Technologies,"Agilent Network Analyzer Basics", www.agilent.com/find/na, Agilent Technologies, Inc. 2004, Aug. 31, 2004, 94 pages.

* cited by examiner

APPARATUS AND METHOD FOR VECTOR S-PARAMETER MEASUREMENTS

FIELD OF THE INVENTION

The present disclosure relates to an apparatus and a method for vector scattering parameter (s-parameter) measurements, and more particularly, to an apparatus and a method for providing a simple, low cost solution for tests requiring vector s-parameter measurements.

BACKGROUND

Vector s-parameter measurements are used for fully characterizing a linear network, ensuring distortion-free transmission, designing efficient matching networks, and deriving accurate device and error models. In a generalized two-port network with characteristic impendence Z0, $S_{11}=b_1/a_1$, describes the reflection/return loss for port 1, $S_{12}=b_1/a_2$ describes the reverse gain/loss, $S_{21}=b_2/a_1$ describes the gain/insertion loss, and $S_{22}=b_2/a_2$ describes the reflection/return loss for port 2.

To determine vector s-parameter measurements, a phase detector down-converts a reference and test channels to make the measurements at a lower frequency. In this method, the phase detector requires extra hardware such as local oscillator sources, mixers, and filters to synchronize, convert and process the signals. Further, in this method, the phase detector requires complex software algorithms to calibrate the system in order to make both magnitude and phase measurements. In another method to determine vector s-parameter measurements, a six-port coupler uses at least three receivers to calculate the phase and another receiver for more accurate measurements, such as phase measurements close to zero and one-hundred eighty degrees. Further, two six-port couplers will be needed for a full two port of measurements. In addition, the six port coupler is a special purpose hardware component, which is not commonly available off the shelf. Thus, this method is problematic because it requires a complex six-port coupler which is not commonly available and because an extra receiver is required for phase measurements which are close to zero and one-hundred eighty degrees.

SUMMARY

In a first aspect of the disclosure, there is an apparatus to provide vector scattering parameter measurements. The apparatus includes a source which provides an input signal, a divider which splits the input signal to a reference signal and a testing signal, a phase shifter which shifts the reference signal by a first phase and outputs a phase shifted signal, a device under test (DUT) which shifts the testing signal by a second phase and outputs a DUT shifted signal, a combiner which combines the phase shifted signal and the DUT shifted signal into a combined signal, and a detector which detects a product of the phase shifted signal and the DUT shifted signal.

In another aspect of the disclosure, there is a method for vector s-parameter calibrations and measurements. The method includes measuring a first magnitude for a corresponding path in a calibration apparatus, shifting a phase through a corresponding phase shifter for the one of the port reflection and the port transmission of the hybrid coupler in the calibration apparatus, measuring a second magnitude at a detector in the calibration apparatus after the phase shifting, and calculating a minimum of the measured first magnitude and the measured second magnitude.

In another aspect of the disclosure, there is an apparatus to provide vector scattering parameter measurements. The apparatus includes a source which provides an input signal, a directional dual hybrid coupler which splits the input signal into the reference signal and the testing signal, a phase shifter which shifts the reference signal by a first phase and outputs a phase shifted signal, a device under test (DUT) which shifts the testing signal by a second phase and outputs a DUT shifted signal, and a detector which detects a product of the phase shifted signal and the DUT shifted signal. The directional dual hybrid coupler also splits a reflection signal from the DUT.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The disclosure relates to an apparatus and a method for vector scattering parameter (s-parameter) measurements, and more particularly, to an apparatus and a method for providing a simple, low cost solution for tests requiring vector s-parameter measurements. In particular, an apparatus of the disclosure includes power dividers, isolators, directional couplers, phase shifters, switches, and broadband detectors in order to obtain s-parameter measurements. Further, the method described herein uses straightforward magnitude measurements to obtain both the magnitude and phase information of reflected or passing-through the device or system under test. Thus, the apparatus and method as described herein provides a simple, low cost solution for tests requiring vector s-parameters measurements.

In embodiments described herein, an apparatus and method provides a simple, low cost solution for tests requiring vector s-parameter measurements. In embodiments, the method can sweep a phase shifter and map the phase shift values to a scalar magnitude measurement. Further, based on the minimum and maximum values of the scalar magnitude measurement, the magnitude and phase information of vector s-parameters of the device under test (DUT) can be obtained. Advantageously, only one receiver is needed, and broadband and inexpensive detectors, such as a diode detector, can be used to make the measurements. Lastly, no signal processing hardware or software is required, which reduces the complexity of the embodiments.

In further embodiments, an apparatus may provide vector scattering parameter (s-parameter) measurements. The apparatus may include a frequency signal source for reference and testing signals, a phase shifter for changing the reference signal phase, a combiner to combine the reference signal and the testing signal reflected from (or through) the device under test (DUT), and a detector to detect the product of the reference signal and the DUT reflected or through a DUT testing signal.

In embodiments, a method provides vector scattering parameter (s-parameter) measurements. The method may include a procedure for test setup calibrations to record the connection path losses and phases with different phase shifter phase settings, a procedure to test device under test (DUT) port reflections $S_{ii}$ (i=1, 2, ..., n; n is the number of ports) magnitude and phase, and a procedure to test DUT port transmissions $S_{ij}$ (i, j=1, 2, ..., n; n is the number of ports and i is not equal to j) magnitude and phase. For example, the test setup calibrations may be performed with a bench network analyzer or with an open/short/through terminations. Further, for magnitude tests at a required frequency, the phase shifter can be set for any known phase setting, the detected power is recorded, and the DUT port reflection or transmission magnitude is calculated as a difference of the detector detected power and a path loss which is recorded during the calibration for the phase shifter phase setting and the frequency. The phase shifter phase settings can be set by a tester.

In embodiments, for phase tests at a required frequency, the phase shifter phase is swept (from zero to three hundred and sixty degrees), the detector detected powers versus the swept phases is recorded, and the DUT port reflection or transmission phase is calculated as a difference of the phase shifter phase setting, at which the detected power is at a minimum during phase sweeping and the path phase which is recorded during the calibration for the frequency.

Figure 1:
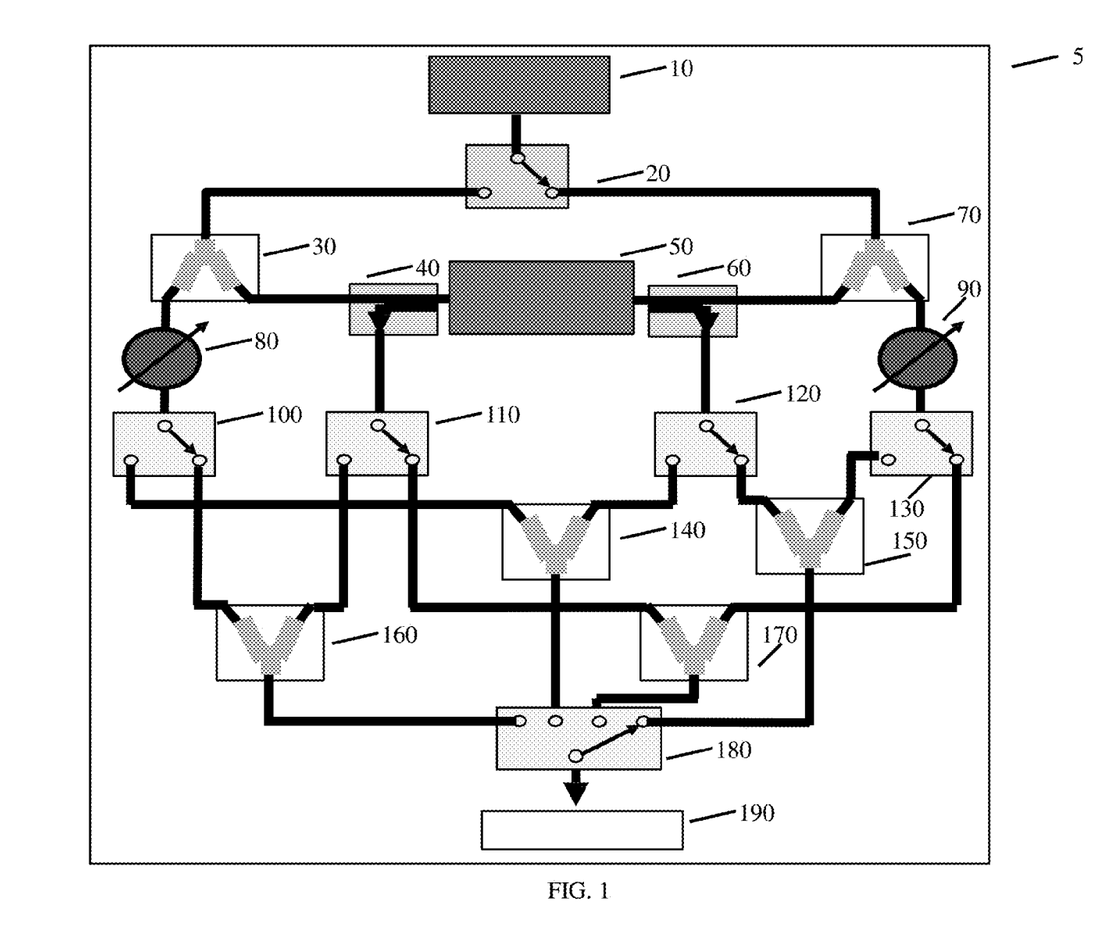
FIG. 1 shows a block diagram of an apparatus for vector s-parameter measurements in accordance with aspects of the disclosure.

FIG. 1 shows a block diagram of an apparatus for vector s-parameter measurements in accordance with aspects of the disclosure. As shown in FIG. 1, apparatus 5 includes an input signal fed from a source 10 through a switch 20. The switch 20 is set so that the input signal is fed to one of a first divider 30 and a second divider 70. For example, if the input signal is fed to the first divider 30, the input signal is passed to a corresponding directional hybrid coupler 40. On the other hand, if the input signal is fed to the second divider 70, the input signal is passed to a corresponding directional hybrid coupler 60. The input signal can be represented by equation 1 below (before it passes through a divider):

$$E^* e^{j\varphi} \quad \text{(Equation 1).}$$

After the input signal is passed to either the corresponding divider 30 or the corresponding divider 70, as an example, 90 degree hybrid dividers are used here, the input signal is split into two signals which is represented by equations 2 and 3 below:

$$(E/2)^* e^{j\varphi} \quad \text{(Equation 2).}$$

$$(E/2)^* e^{j(\varphi+90)} \quad \text{(Equation 3).}$$

As shown above, equation 2 represents the in-phase signal. The in-phase signal is then fed to the device under test (DUT) 50 through the directional hybrid coupler 40 or 60, and the output of the DUT 50 is represented by equation 4 below, the DUT outputs can be the signal passing through the DUT or the signal reflected from the DUT:

$$D^*(E/2)^* e^{j(\varphi+\theta)} \quad \text{(Equation 4).}$$

In equation 4 above, "D" is a constant which represents the gain or attenuation of the DUT 50 that affects the magnitude of the signal. Further, in equation 4 above, θ is the phase shift caused by the DUT 50.

As shown above, equation 3 represents the out-of-phase signal. The out-of-phase signal is then passed through either the corresponding phase shifter 80 or the corresponding phase shifter 90. When the out-of-phase signal is passed through either the corresponding phase shifter 80 or the corresponding phase shifter 90, the phase is shifted by δ as shown in equation 5 below:

$$P^*(E/2)^* e^{j(\varphi+90+\delta)} \quad \text{(Equation 5).}$$

In equation 5 above, "P" is a constant which represents the gain or attenuation of either the corresponding phase shifter 80 or the corresponding phase shifter 90 that affects the magnitude of the signal. Further, in equation 5 above, δ is the phase shift caused by either the corresponding phase shifter 80 or the corresponding phase shifter 90.

Still referring to FIG. 1, both of the signals in equations 4 and 5 travels through one of the corresponding switches 100, 110, 120, and 130 and are then combined together in one of the combiners 140, 150, 160, and 170. The combined signal is then fed to the detector 190 through the switch 180. The DUT output is on an in-phase leg, while the phase shifter output is on an out-of-phase leg at the corresponding combiners 140, 150, 160 and 170, assuming 90 degree hybrid combiners are used. As a result, a total signal T is represented by equation 6 below (assuming ideal signal paths, i.e. no path loss, no path phase shift):

$$T=D^*(E/2)^* e^{j(\varphi+\theta)} + P^*(E/2)^* e^{j(\varphi+180+\delta)} \quad \text{(Equation 6).}$$

In equation 6 above, the total signal "T" is then passed to the detector 190. After rearranging the total signal, the magnitude of the total signal T is represented by equation 7 below:

$$|T|=(E/2)^* \sqrt{[(D^* \cos\theta - P^* \cos(\delta))^2 + (D^* \sin\theta - P^* \sin(\delta))^2]} \quad \text{(Equation 7).}$$

When the first derivative of the total signal "T" is set to zero, the phase shift introduced by DUT 50 is equal to the phase shift introduced by one of the corresponding phase shifter 80 and the corresponding phase shifter 90. Thus, when the first derivative of the total signal "T" in equation 7 is set to zero, equation 8 is represented below:

$$\cos\theta^* \sin\delta = \cos\delta^* \sin\theta \quad \text{(Equation 8).}$$

Based on equation 8 above, at a peak (e.g., minima for positive signals and maxima for negative signals), the phase of DUT 50 is equal to the phase shift of one of the corresponding phase shifter 80 and the corresponding phase shifter 90. In this way, the phase of DUT 50 can be calculated based on equation 8. In other words, the phase of DUT 50 can be calculated based on a phase shifter setting that corresponds to the peak. Further, the magnitude of the DUT 50 can be calculated based on scalar measurements.

Figure 2:
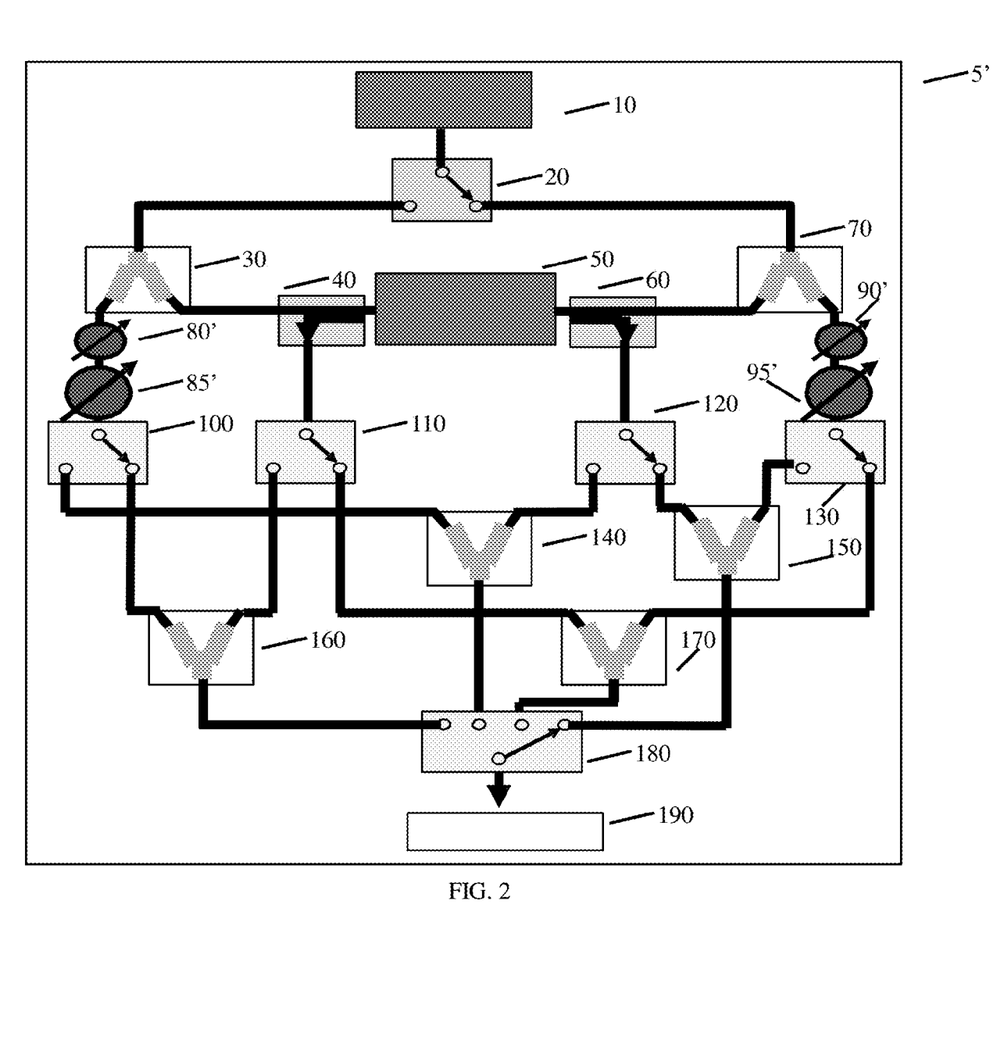
FIG. 2 shows a block diagram of an apparatus for vector s-parameter measurements in accordance with additional aspects of the disclosure.

FIG. 2 shows a block diagram of another apparatus for vector s-parameter measurements in accordance with aspects of the disclosure. As shown in FIG. 2, the apparatus 5' includes the components of the apparatus 5 of FIG. 1, with the addition of two types of phase shifters (as opposed to one type of phase shifter in FIG. 1). As should be understood by those of ordinary skill in the art, like components are labeled similarly such that no further explanation is required for a complete understanding of the invention.

In particular, in FIG. 2, on one side of the switch 20, there is a coarse tune phase shifter 80' and a fine tune phase shifter 85'. On the other side of the switch 20, there is a coarse tune phase shifter 90' and a fine tune phase shifter 95'. In FIG. 2, having both a coarse tune phase shifter and a fine tune phase shifter helps to improve the accuracy of the measurement. Accordingly, the operation of the apparatus 5' of FIG. 2 is similar to the operation of the apparatus 1 of FIG. 5, except for the out-of-phase signal of an input signal being passed through two phase shifters (e.g., a coarse tune phase shifter 80' and a fine tune phase shifter 85'). Thus, in comparison to FIG. 1, the apparatus 5' in FIG. 2 improves the measurement accuracy because of the two types of phase shifters.

Figure 3:
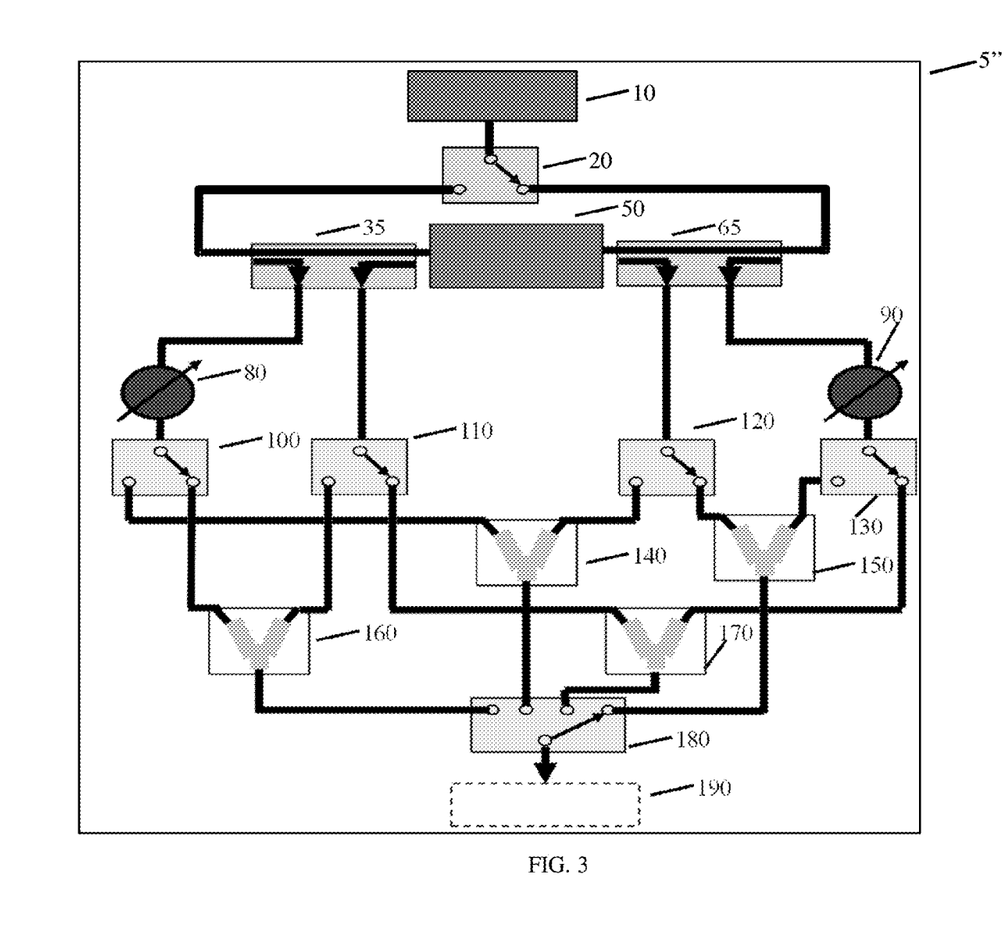
FIG. 3 shows a block diagram of an apparatus for vector s-parameter measurements in accordance with additional aspects of the disclosure.

FIG. 3 shows a block diagram of another apparatus for vector s-parameter measurements in accordance with aspects of the disclosure. As shown in FIG. 3, apparatus 5'' shows many of the same components as shown in the apparatus 5 of FIG. 1, in addition to a directional hybrid dual coupler 35 and a directional hybrid dual coupler 65; whereas, the apparatus 5 of FIG. 1 used a first divider 30, a directional hybrid coupler 40, a second divider 70, and a directional hybrid coupler 60 in FIG. 1. Thus, in FIG. 3, hardware complexity is reduced and fewer components are needed in comparison to FIG. 1. As should be understood by those of ordinary skill in the art, like components are labeled similarly such that no further explanation is required for a complete understanding of the invention.

Figure 4:
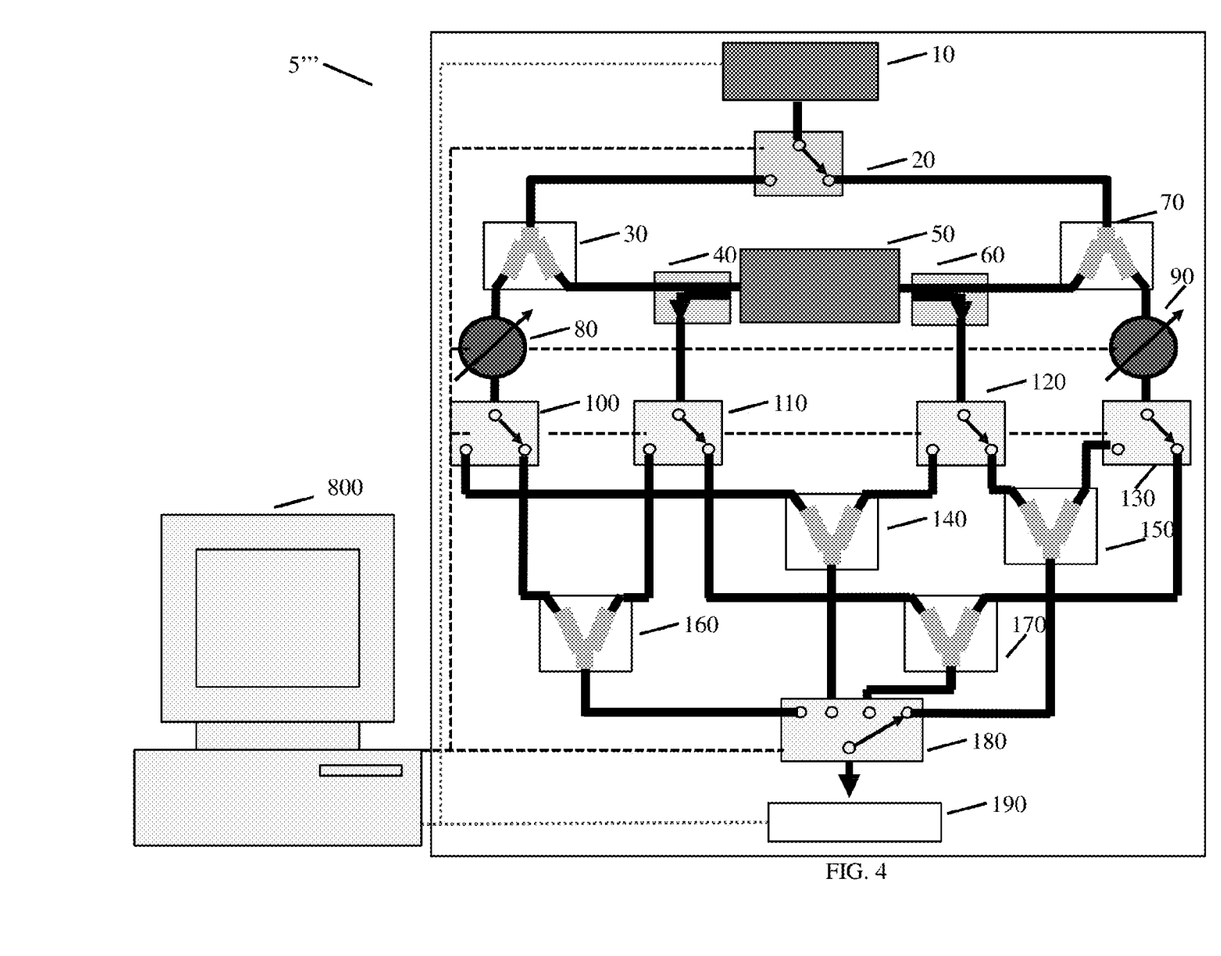
FIG. 4 shows a block diagram of an apparatus for vector s-parameter measurements in accordance with additional aspects of the disclosure.

FIG. 4 shows a block diagram of another apparatus for vector s-parameter measurements in accordance with aspects of the disclosure. The apparatus 5''' of FIG. 4 shows many of the same components as shown in the apparatus 5 of FIG. 1, except the apparatus 5''' is connected to a controller 800. Although the controller 800 is shown as a computer in FIG. 4, controller 800 may also be a processor, an electrical circuit, a controlling unit, or a special purpose hardware circuit for controlling the apparatus 5'''. Further, although the controller 800 is shown as one controller, controller 800 may include a first controller and a second controller. For example, the first controller of controller 800 may be used to control phase shifters 80, 90, switches 20, 100, 110, 120, 130, and switch 180; whereas, the second controller of controller 800 may be used to control the programming, algorithms, and calibration of the apparatus 5'''.

As shown in FIG. 4, the controller 800 is connected to control the phase shifters 80, 90, switches 20, 100, 110, 120, 130, and switch 180 through the square dot dashed lines. Further, as shown in FIG. 4, the controller 800 is connected to the source 10 and the detector 190 through the round dot dashed lines to control the programming, algorithms, and calibration of the fourth apparatus 5'''. The operation of the apparatus 5''' of FIG. 4 is similar to the operation of the first apparatus 5 of FIG. 1. However, in FIG. 4 and in contrast to FIG. 1, the apparatus 5''' is controlled by a controller 800.

Figure 5:
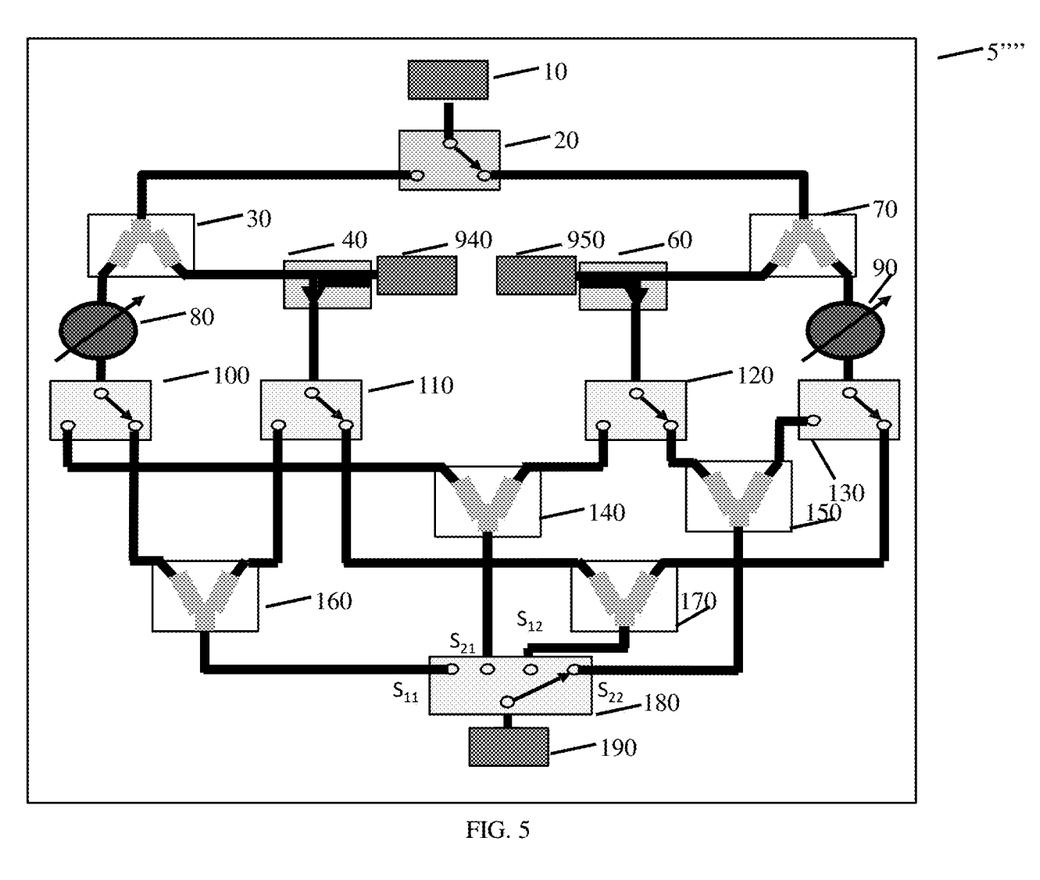
FIG. 5 shows a block diagram of an apparatus for vector s-parameter measurement calibration in accordance with additional aspects of the disclosure.

FIG. 5 shows a block diagram of an apparatus for vector s-parameter measurement calibration in accordance with aspects of the disclosure. In embodiments, each of the apparatuses shown in FIGS. 1-5 should be calibrated. After the calibration is performed, the results of the calibration will be used to set a baseline for each of the apparatuses in FIGS. 1-4. Further, a bench network analyzer (not shown) may be used to perform the calibrations with an open, short, or/and through calibration standards, other type calibration standards may be also used. The apparatus 5'''' of FIG. 5 shows many of the same components as shown in the apparatus 5 of FIG. 1, except the apparatus 5'''' has a device 940 and a device 950 instead of the DUT 50, which represent the open, short, and through calibration standards, or other type of calibration standards, and also represent terminal ports to which the bench test equipment can be connected.

As shown in FIG. 5, in order to calibrate the apparatus 5'''' and measure the S parameters of a DUT, a number of measurements are executed to obtain the magnitude and phase information for the paths. For example, the plurality of paths which should be executed during calibration and/or measurement (e.g., 14 different paths), are shown below in Table 1 with references:

TABLE 1

| Path Label | Path |
| --- | --- |
| A1 | Source 10-Switch 20-Divider 30-Phase Shifter 80-Switch 100-Combiner 140-Switch 180-Detector 190 |
| A2 | Source 10-Switch 20-Divider 30-Phase Shifter 80-Switch 100-Combiner 160-Switch 180-Detector 190 |
| A3 | Source 10-Switch 20-Divider 30-Directional Hybrid Coupler 40-Switch 110-Combiner 160-Switch 180 -Detector 190 |
| A4 | Source 10-Switch 20-Divider 30-Directional Hybrid Coupler 40-Switch 110-Combiner 170-Switch 180-Detector 190 |
| A5 | Source 10-Switch 20-Divider 30-Directional Hybrid Coupler 40-Device 940 |
| B1 | Source 10-Switch 20-Divider 70-Phase Shifter 90-Switch 130-Combiner 150-Switch 180-Detector 190 |
| B2 | Source 10-Switch 20-Divider 70-Phase Shifter 90-Switch 130-Combiner 170-Switch 180-Detector 190 |
| B3 | Source 10-Switch 20-Divider 70-Directional Hybrid Coupler 60-Switch 120-Combiner 150-Switch 180-Detector 190 |
| B4 | Source 10-Switch 20-Divider 70-Directional Hybrid Coupler 60-Switch 120-Combiner 140-Switch 180-Detector 190 |
| B5 | Source 10-Switch 20-Divider 70-Directional Hybrid Coupler 60-Device 950 |
| C1 | Device 940-Directional Hybrid Coupler 40-Switch 110-Combiner 160-Switch 180-Detector 190 |
| C2 | Device 940-Directional Hybrid Coupler 40-Switch 110-Combiner 170-Switch 180-Detector 190 |
| D1 | Device 950-Directional Hybrid Coupler 60-Switch 120-Combiner 150-Switch 180-Detector 190 |
| D2 | Device 950-Directional Hybrid Coupler 60-Switch 120-Combiner 140-Switch 180-Detector 190 |

As shown in FIG. 5 and Table 1 above, for $S_{11}$ calibration, a known open device, i.e. an open circuit device which has known reflection magnitude of about 1 and known reflection phase of about 0 degree, is connected in FIG. 5 as the device 940. For $S_{11}$ magnitude calibration, the path A3 is measured and recorded as $CAS_{11}$ (not shown). $CAS_{11}$ can be used directly as the measure of path loss for the path A3 if the known open device is ideal, i.e. the reflection magnitude is 1 and the reflection phase is 0 degree; otherwise a correction may be needed to remove the impact of the non-ideal open device from the $CAS_{11}$. Then for $S_{11}$ phase calibration, there is a sweep through the phase shifter 80, and the phase difference is measured between path A3 and A2, recorded as $PCS_{11}$ (not shown), which can be used directly as the measure of phase difference of paths A3 and A2 when the open device is ideal, otherwise a correction may be needed to remove the impact of non-ideal open device from $PCS_{11}$.

After the steps of recording $CAS_{11}$ and $PCS_{11}$ are performed, to find $S_{11}$ of a DUT, the same steps above are performed after replacing the device 940 with a DUT (e.g., DUT 50 in FIG. 1). To find the $S_{11}$ magnitude of a DUT (e.g., DUT 50 in FIG. 1), A3 path is measured, and recorded as $DAS_{11}$. Then, the $S_{11}$ magnitude of the DUT is calculated by equation 9 below in dB:

$$|S_{11}|=DAS_{11}-CAS_{11} \qquad \text{(Equation 9)}.$$

To find the $S_{11}$ phase of a DUT (e.g., DUT 50 in FIG. 1), the phase of phase shifter 80 is swept, and the phase difference is measured between path A3 and A2, and recorded as $PDS_{11}$. Then, the $S_{11}$ phase of the DUT is calculated by equation 10 below:

$$\text{Phase of } S_{11} = PDS_{11} - PCS_{11} \quad \text{(Equation 10)}.$$

For $S_{21}$ calibration in FIG. 5, a through line is used as the devices 940 and 950. For the $S_{21}$ magnitude calibration, the path A5 and D2, which now form a new path from the source 10 to the detector 190, is measured, and recorded as $CAS_{21}$, which can be used directly as the measure of path loss for the path A5 plus D2 if the through line is ideal, i.e. the insertion loss magnitude is 0 and the propagation phase is 0 degree; otherwise a correction may be needed to remove the impact of the non-ideal through line from the $CAS_{21}$. For $S_{21}$ phase calibration, there is a sweep through the phase shifter 80, and the phase difference is measured between paths A1 and A5+D2, recorded as $PCS_{21}$, which can be used directly as the measure of phase difference of the paths A1 and A5+D2 if the through line is ideal, i.e. the insertion loss magnitude is 0 and the propagation phase is 0 degree; otherwise a correction may be needed to remove the impact of the non-ideal through line from the $PCS_{21}$.

After the steps of recording $CAS_{21}$ and $PCS_{21}$ are performed, the same steps above are performed when a DUT (e.g., DUT 50 in FIG. 1) replaces the device 940 and the device 950. To find the $S_{21}$ magnitude of the DUT, the path A5 plus D2 is measured, and recorded as $DAS_{21}$. Then, the $S_{21}$ magnitude of the DUT is calculated by equation 11 below in dB:

$$|S_{21}| = DAS_{21} - CAS_{21} \quad \text{(Equation 11)}.$$

To find the $S_{21}$ phase of the DUT, the phase of the phase shifter 80 is swept, and the phase difference is measured between path A1 and A5+D2, and recorded as $PDS_{21}$. Then, the $S_{21}$ phase of the DUT is calculated by equation 12 below:

$$\text{Phase of } S_{21} = PDS_{21} - PCS_{21} \quad \text{(Equation 12)}.$$

For the $S_{12}$ calibration in FIG. 5, a through line is used as the devices 940 and 950. For the S12 magnitude calibration, the paths B5 and C2, which form a new path, are measured, and recorded as $CAS_{12}$, which can be used directly as the measure of path loss for the path B5 plus C2 if the through line is ideal, i.e. the insertion loss magnitude is 0 and the propagation phase is 0 degree; otherwise a correction may be needed to remove the impact of the non-ideal through line from the $CAS_{12}$. Then for the $S_{12}$ phase calibration, there is a sweep through the phase shifter 90, and the phase difference is measured between path B1 and B5+C2, recorded as $PCS_{12}$, which can be used directly as the measure of phase difference of the paths B1 and B5+C2 if the through line is ideal, i.e. the insertion loss magnitude is 0 and the propagation phase is 0 degree; otherwise a correction may be needed to remove the impact of the non-ideal through line from the $PCS_{12}$.

After the steps of recording $CAS_{12}$ and $PCS_{12}$ are performed, the same steps above are performed when a DUT (e.g., DUT 50 in FIG. 1) replaces the device 940 and the device 950. To find the S12 magnitude of the DUT, the path B5 plus C2 is measured, and recorded as $DAS_{12}$. Then, the S12 magnitude of the DUT is calculated by equation 13 below in dB:

$$|S_{12}| = DAS_{12} - CAS_{12} \quad \text{(Equation 13)}.$$

To find the $S_{12}$ phase of the DUT, the phase of the phase shifter 90 is swept, and the phase difference is measured between path B1 and path B5+C2, and recorded as $PDS_{12}$. Then, the $S_{12}$ phase of the DUT is calculated by equation 14 below:

$$\text{Phase of } S_{12} = PDS_{12} - PCS_{12} \quad \text{(Equation 14)}.$$

For the $S_{22}$ calibration, a known open device is used as the device 950. For $S_{22}$ magnitude calibration, the path B3 is measured, recorded as $CAS_{22}$, which can be used directly as the measure of path loss for the path B3 if the known open device is ideal, i.e. the reflection magnitude is 1 and the reflection phase is 0 degree; otherwise a correction may be needed to remove the impact of the non-ideal open device from the $CAS_{22}$. Then for $S_{22}$ phase calibration, there is a sweep through the phase shifter 90, and the phase difference is measured between path B3 and B2, and recorded as $PCS_{22}$, which can be used directly as the measure of phase difference of paths B3 and B2 when the open device is ideal, otherwise a correction may be needed to remove the impact of non-ideal open device from $PCS_{22}$.

After the steps of recording $CAS_{22}$ and $PCS_{22}$ are performed, the same steps above are performed when a DUT (e.g., DUT 50 in FIG. 1) replaces the device 940 and the device 950. To find the $S_{22}$ magnitude of the DUT, B3 path is measured, and recorded as $DAS_{22}$. Then, the $S_{22}$ magnitude of the DUT is calculated by equation 15 below in dB:

$$|S_{22}| = DAS_{22} - CAS_{22} \quad \text{(Equation 15)}.$$

To find the $S_{22}$ phase of the DUT, the phase of the phase shifter 90 is swept, and the phase difference is measured between paths B3 and B2, and recorded as $PDS_{22}$. Then, the $S_{22}$ phase of the DUT is calculated by equation 16 below:

$$\text{Phase of } S_{22} = PDS_{22} - PCS_{22} \quad \text{(Equation 16)}.$$

Figure 6:
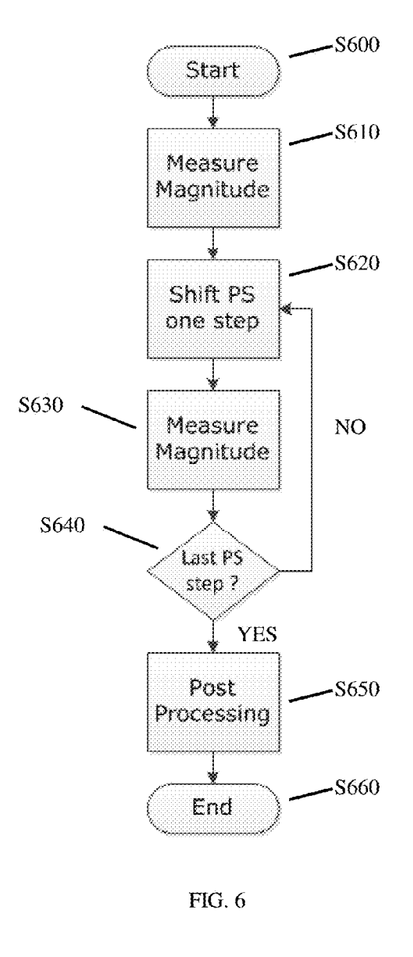
FIG. 6 shows a method implementing apparatus shown in FIG. 5, for vector s-parameter measurement calibration in accordance with aspects of the disclosure.

FIG. 6 shows a method implemented using the apparatus for vector s-parameter measurements and calibrations as shown in FIG. 5, in accordance with aspects of the disclosure. At step S600, the method is started. Then, at step S610, the magnitude is measured. For the $S_{11}$ magnitude measurement, this includes measuring A3 path, accounting for the calibration, and calculating $|S_{11}|$. For the $S_{21}$ magnitude measurement, this includes measuring the A5 and D2 paths, accounting for the calibration, and calculating $|S_{21}|$. For the $S_{12}$ magnitude measurement, this includes measuring B5 and C2 paths, accounting for the calibration, and calculating $|S_{12}|$. For the $S_{22}$ magnitude measurement, this includes measuring B3 path, accounting for the calibration, and calculating $|S_{22}|$.

At step S620 of FIG. 6, the phase shifter is shifted one step. For $S_{11}$ and $S_{21}$ phase measurements, this includes shifting the phase shifter 80 by one step. For $S_{12}$ and $S_{22}$ phase measurements, this includes shifting the phase shifter 90 by one step. At step S630, the magnitude is measured at the detector 190. Then, at step S640, a determination is made if this is the last phase shift step. If this is not the last phase shift step at step S640, then the method returns to step S620. On the other hand, if it is determined that this is the last phase shift step at step S640, the method continues to step S650. At step S650, post processing occurs, in which the minimum of magnitudes recorded is found. Finally, at step S660, the method ends and the results are reported.

The method as described above is used in the testing and fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for vector s-parameter calibrations and measurements, comprising:
    measuring a first magnitude for a corresponding path in a calibration apparatus;
    shifting a phase through a corresponding phase shifter for the corresponding path in the calibration apparatus;
    measuring a second magnitude at a detector in the calibration apparatus after the phase shifting; and
    calculating a minimum of the measured first magnitude and the measured second magnitude.

2. The method of claim 1, further comprising a bench vector network analyzer to calibrate paths in the calibration apparatus.

3. The method of claim 1, further comprising calculating a magnitude of the corresponding path based on the measured first magnitude and a phase of the corresponding path based on the calculated minimum of the measured second magnitude.

4. The method of claim 1, further comprising a device under test (DUT), wherein a port reflection of the DUT is Sii, i=1, 2, . . . , n and n is a number of ports of the DUT.

5. The method of claim 1, further comprising a device under test (DUT), wherein a port transmission of a device under test (DUT) is Sij, i, j=1, 2, . . . , n, n is a number of ports of the DUT, and i is not equal to j.

6. The method of claim 1, wherein the calibration apparatus includes at least one open device with a reflection magnitude of about 1 and a reflection phase of about 0 degrees.

7. The method of claim 1, further comprising determining whether the phase shift is a last phase shift.

8. The method of claim 7, further comprising shifting another phase through the corresponding phase shifter for the corresponding path in the calibration apparatus in response to determining that the phase shift is not the last phase shift.

9. The method of claim 8, wherein the another phase shift and the phase shift have a same phase shift value.

* * * * *